(12) United States Patent
Lee et al.

(10) Patent No.: US 7,482,904 B2
(45) Date of Patent: Jan. 27, 2009

(54) DEVICE FOR IMPROVING AMPLITUDE IMBALANCE OF ON-CHIP TRANSFORMER BALUN

(75) Inventors: Dong Hyun Lee, Anyang-si (KR); Sang Yoon Jeon, Seoul (KR); Seong Soo Lee, Suwon-si (KR); Heung Bae Lee, Suwon-si (KR); Hai Young Lee, Seongnam-si (KR); Sung Ho Joo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/540,711

(22) Filed: Oct. 2, 2006

(65) Prior Publication Data

US 2007/0268106 A1    Nov. 22, 2007

(30) Foreign Application Priority Data

May 17, 2006    (KR) ........................ 10-2006-0044444

(51) Int. Cl.
*H01F 5/00* (2006.01)
*H01F 27/28* (2006.01)

(52) U.S. Cl. .................. 336/200; 336/223; 336/232

(58) Field of Classification Search .................. 336/232, 336/200, 223
See application file for complete search history.

(56) References Cited

U.S. PATENT DOCUMENTS

| 6,396,362 | B1 | 5/2002 | Mourant et al. | |
|---|---|---|---|---|
| 6,927,664 | B2* | 8/2005 | Nakatani et al. | ............ 336/200 |
| 7,233,224 | B2* | 6/2007 | Strzalkowski et al. | ........ 336/200 |
| 7,253,712 | B1* | 8/2007 | Papananos | .................. 336/200 |
| 2003/0085788 | A1 | 5/2003 | Yue | |
| 2004/0085175 | A1 | 5/2004 | Lowther | |
| 2006/0202776 | A1* | 9/2006 | Lee et al. | ...................... 333/25 |

FOREIGN PATENT DOCUMENTS

WO    WO 02/052590 A2    7/2002

* cited by examiner

*Primary Examiner*—Anh T Mai
(74) *Attorney, Agent, or Firm*—Sughrue Mion, PLLC

(57) ABSTRACT

An on-chip transformer balun includes a primary winding as an input terminal of the on-chip transformer balun, and a secondary winding as an output terminal of the on-chip transformer balun, wherein one of the primary winding and secondary winding is formed of a plurality of metal layers in which a spiral trace portion excluding an underpass is disposed on mutually different layers to have an asymmetrical structure.

8 Claims, 9 Drawing Sheets

DEVICE FOR IMPROVING AMPLITUDE IMBALANCE OF ON-CHIP TRANSFORMER BALUN

CROSS-REFERENCE TO RELATED APPLICATION

This application claims priority from Korean Patent Application No. 10-2006-0044444, filed on May 17, 2006, in the Korean Intellectual Property Office, the disclosure of which is incorporated herein by reference.

BACKGROUND OF THE INVENTION

1. Field of the Invention

The present invention relates to a device for improving amplitude imbalance occurring between two output terminals of an on-chip transformer balun, and more particularly, to an on-chip transformer balun device improving the amplitude imbalance by controlling an inter-winding capacitance value by designing an asymmetrical structure in which one of the primary winding and secondary winding is formed of a plurality of metal layers in which a spiral trace portion, excluding an underpass, is disposed on mutually different layers.

2. Description of the Related Art

A balun is a transformer for matching, used for coupling a circuit that is balanced with the ground with an amplification circuit whose end is grounded, for preventing ground balance of a balanced circuit from being broken, and for connecting a circuit balanced with the ground to an unbalanced circuit, such as a coaxial cable, in a transmission circuit in a microwave band, and functions as a device mutually transforming balanced/unbalanced signals.

A Marchand balun is generally used in a form of an off-chip device in microwave applications, designed to have a length of ¼ of an electric wave of a corresponding frequency, thereby increasing an area occupied on a wafer and increasing manufacturing cost when applied as an on-chip device associated with application in a band less than several GHz.

FIG. 1A is a diagram illustrating structures of a conventional Marchand balun 110 and FIG. 1B is diagram illustrating a conventional overlay transformer balun 120. Generally, in an on-chip device, a balun applying a transformer is used and may achieve similar performance with an area smaller than the Marachand balun 110.

As structures of the transformer balun, there are a planar type and an overlay type. Since most complementary metal oxide semiconductor (CMOS) foundries provide a primary winding 121 and a secondary winding 122, which have multi-metal layers as a form of the overlay transformer balun 120, these are most economical.

However, deterioration of performance due to parasitic capacitance occurs in the overlay transformer balun 120.

FIG. 2A is a diagram illustrating a structure of a conventional on-chip transformer balun 210, and deterioration of performance, caused by the structure. As shown in FIG. 2, the conventional on-chip transformer balun 210 including the overlay transformer balun 120 includes a primary winding 211 and a secondary winding 212.

In this case, the primary winding 211 is connected to a first port 213 and a ground 214, and the secondary winding 212 is connected to a second port 216 and a third port 217, based on a center tap 215.

In this case, in a 1:n transformer compact model, although an input signal inputted via the first port 213 is transformed and transmitted to output terminals of the second port 216 and the third port 217 by magnetized coupling between the primary winding 211 and the secondary winding 212, actually, performance is deteriorated by unexpected coupling in addition to the magnetizing coupling, occurring due to parasitic capacitance as frequency becomes high.

The on-chip transformer balun 210 forms inverting and non-inverting connections due to a property of signal transmission between input and output devices. According to the inverting and non-inverting connections between input and output devices, an effect of the coupling between the primary winding 211 and the secondary winding 212, occurring due to the parasitic capacitance, shows asymmetry with low-pass filter and band-pass filter effects, respectively, thereby increasing amplitude imbalance between two output terminals as a frequency becomes higher. A graph 220 illustrated in FIG. 2B shows an effect of the parasitic capacitance 221 via a relation between transmission coefficient magnitude displayed in dB, and a frequency. As shown in the effect of the parasitic capacitance, as the frequency becomes higher, a difference between the transmission coefficient magnitudes becomes greater.

As described above, in the conventional on-chip transformer balun 210, since the amplitude imbalance between the two output terminals rapidly becomes greater as the frequency becomes higher, a usable frequency bandwidth is limited to a low frequency band.

SUMMARY OF THE INVENTION

Illustrative, non-limiting exemplary embodiments of the present invention overcome the above disadvantages, and other disadvantages not described above.

The present invention provides a new technology associated with a device for improving amplitude imbalance occurring between two output terminals of an on-chip transformer balun.

According to an aspect of the present invention, there is provided an improvement in the amplitude imbalance by controlling parasitic capacitance by separating one of a primary winding and a secondary winding into a plurality of metal layers disposed on mutually different layers and using a difference between a physical distance between the plurality of the separated metal layers and the primary winding, or a physical distance between the metal layers and the secondary winding.

According to another aspect of the present invention there is provided a reduction of an information corruption phenomenon due to ingress of an undesirable signal, caused by the amplitude imbalance, in a direct transformation receiver, by improving a common mode noise reduction property by improving the amplitude imbalance between the two output terminals of the on-chip transformer balun in a high frequency band.

According to yet another aspect of the present invention there is provided an integration of the on-chip transformer balun into radio frequency integrated circuits (RFICs), instead of being an off-chip balun, by improving limitations of a property of the high frequency band of the on-chip transformer balun by using the improved amplitude imbalance.

According to yet another aspect of the present invention, there is provided an on-chip transformer balun including: a primary winding as an input terminal of the on-chip transformer balun; and a secondary winding as an output terminal of the on-chip transformer balun, wherein one of the primary winding and secondary winding is formed of a plurality of metal layers in which a spiral trace portion excluding an underpass is disposed on mutually different layers to have an asymmetrical structure.

The metal layer may include a first metal layer and a second metal layer. When the secondary winding is formed of the metal layers, amplitude imbalance generated between two output terminals of the secondary winding in a high frequency band may be improved by controlling parasitic capacitance coupling by using a difference between a physical distance between the primary winding and the first metal layer and a physical distance between the primary winding and the second metal layer.

The parasitic capacitance coupling may be controlled by a Co1 that is a parasitic capacitance value of the primary winding and the first metal layer, and a Co2 that is a parasitic capacitance value of the primary winding and the second metal layer.

When the Co1 has a relatively smaller value than the Co2, since an impedance value of the Co1 is relatively greater than an impedance value of the Co2, signals dominantly coupled with one port of the output terminals may be reduced. The Co1 and the Co2 may be inversely proportional to the distance between the primary winding and the first metal layer and the distance between the primary winding and the second metal layer.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF THE INVENTION

Figure 1A:
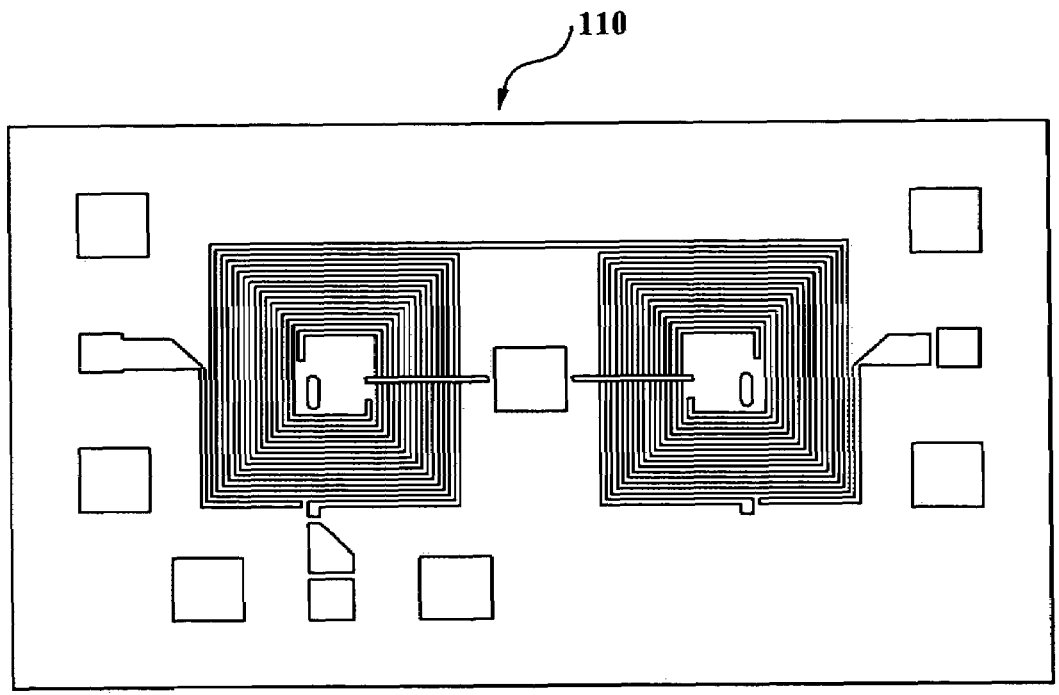
FIG. 1A is a diagram illustrating structures of a conventional Marchand balun.
Figure 1B:
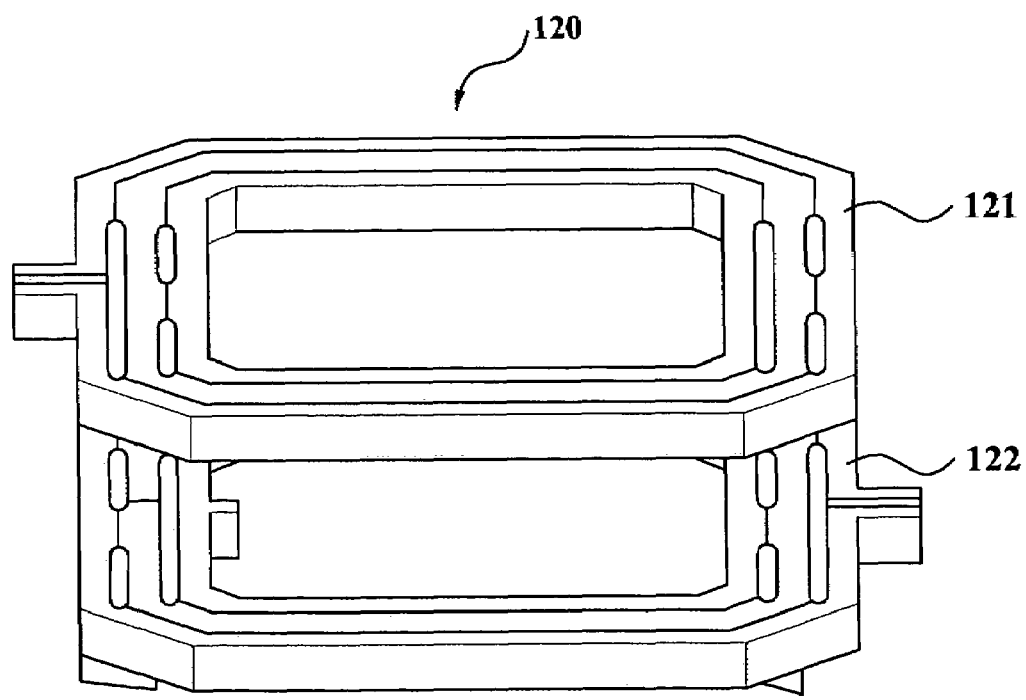
FIG. 1B is a diagram illustrating structures of a conventional overlay transformer balun.
Figure 2A:
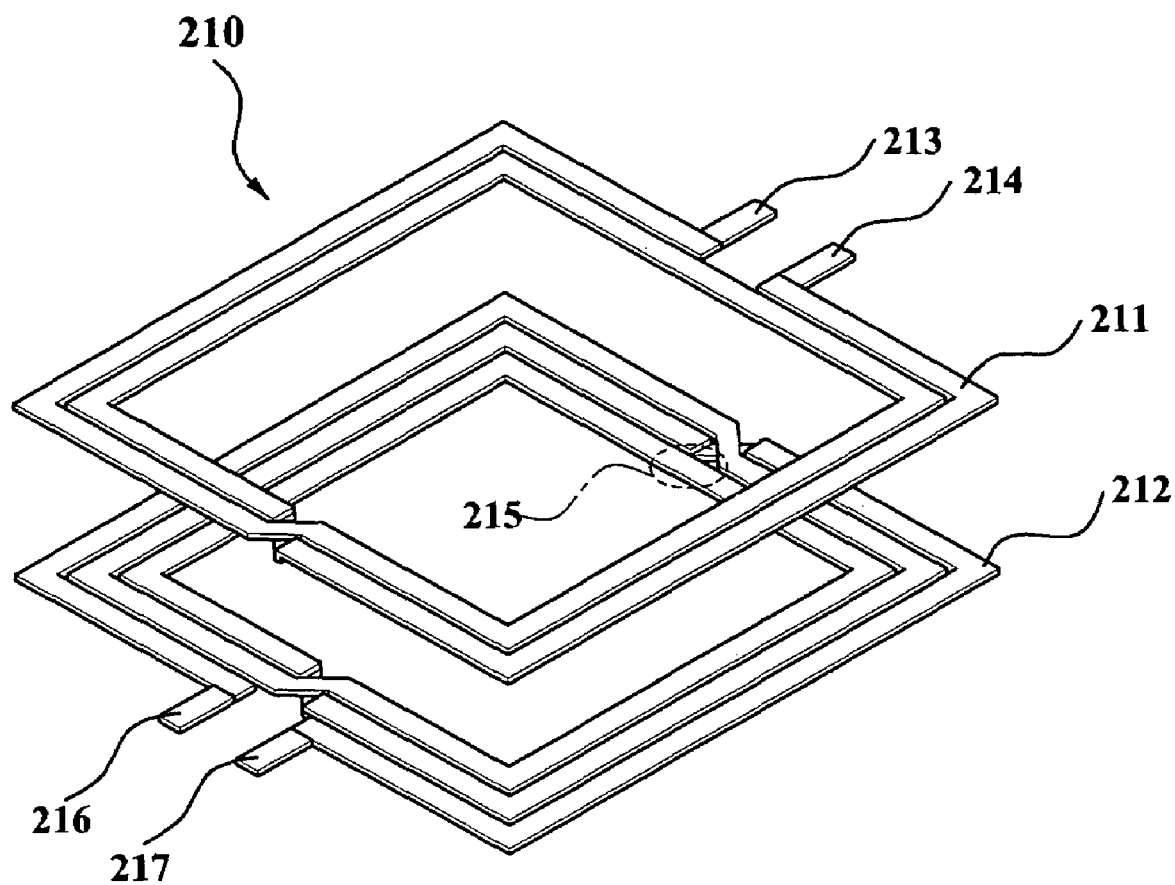
FIG. 2A is a diagram illustrating a structure of a conventional on-chip transformer balun 210.
Figure 2B:
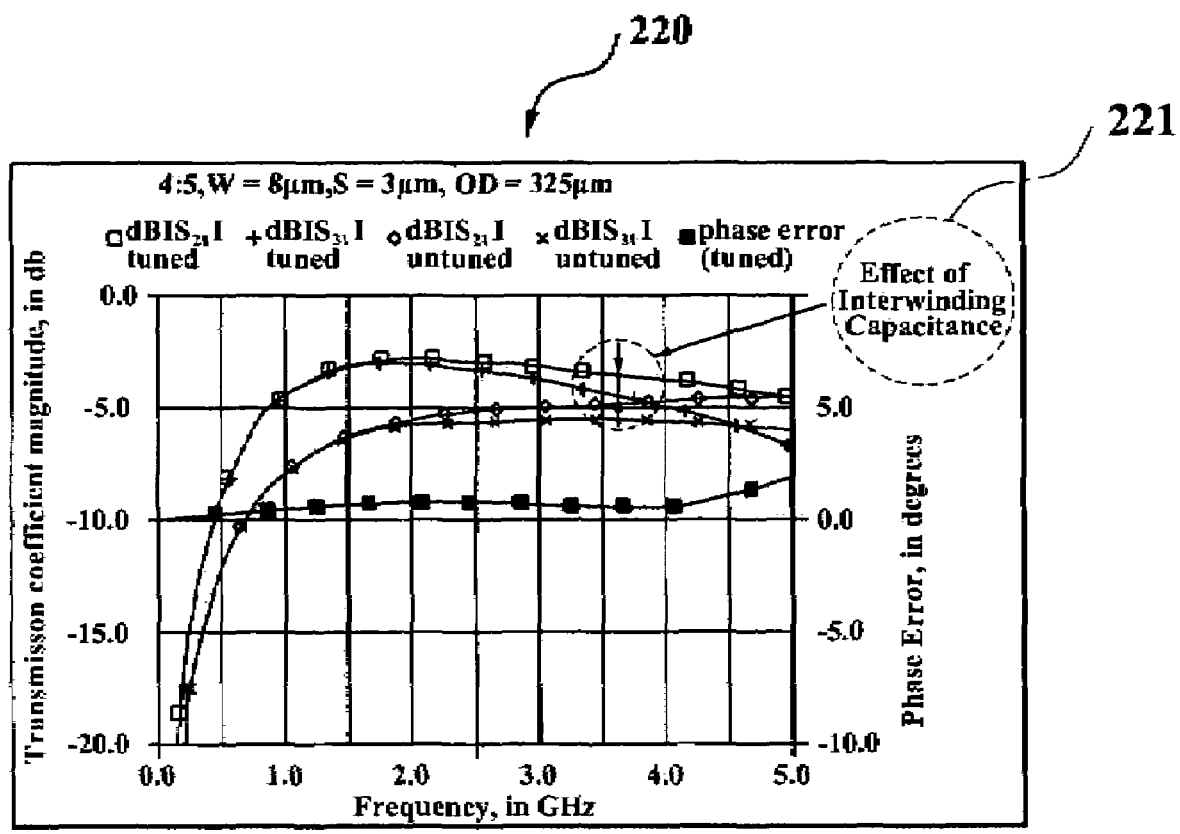
FIG. 2B illustrates deterioration of performance, caused by the structure.

Reference will now be made in detail to the exemplary embodiments of the present invention, examples of which are illustrated in the accompanying drawings, wherein like reference numerals refer to the like elements throughout.

Figure 3:
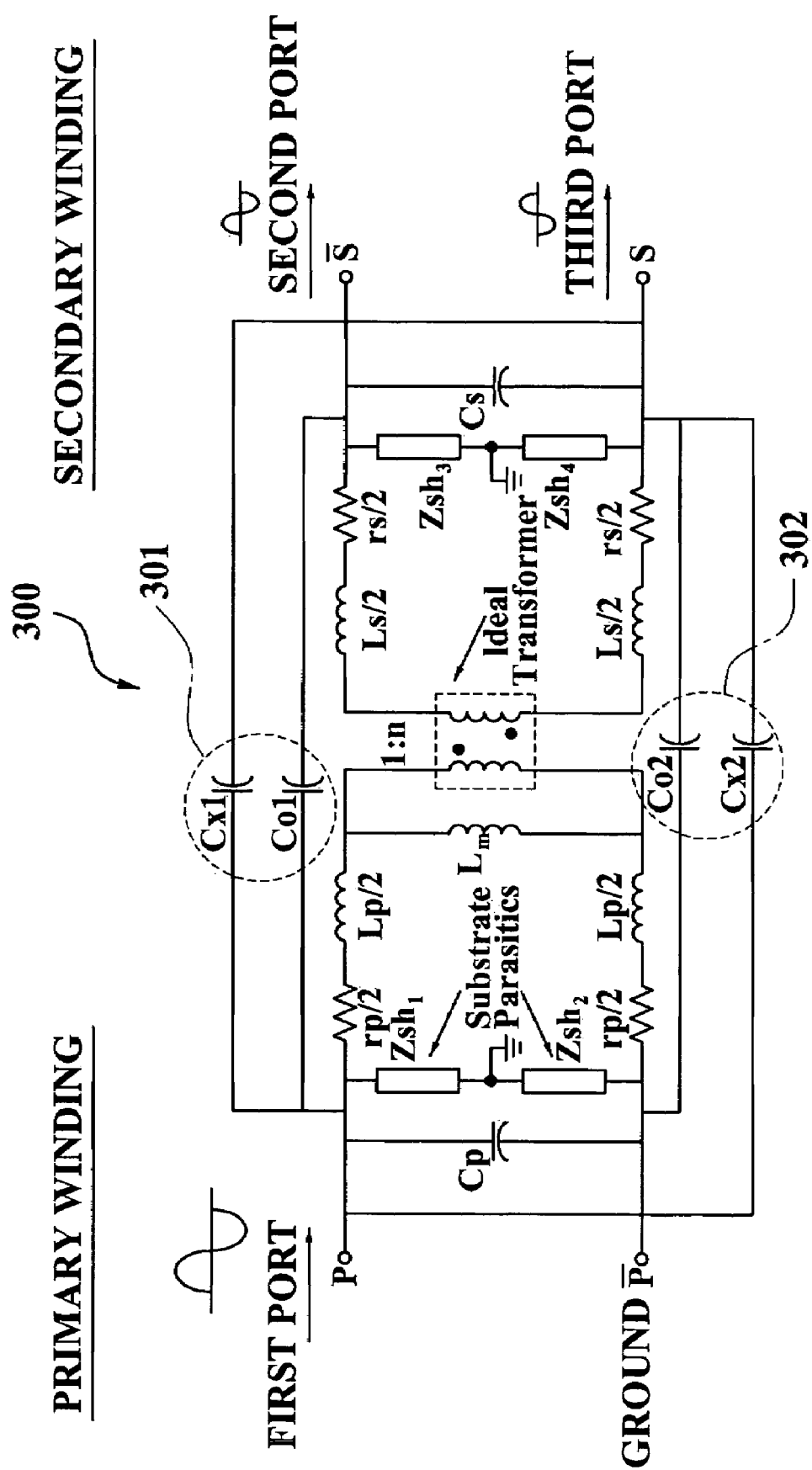
FIG. 3 is a diagram illustrating a schematic for improving amplitude imbalance, according to an exemplary embodiment of the present invention.

FIG. 3 is a diagram illustrating a schematic for improving amplitude imbalance, according to an exemplary embodiment of the present invention. Referring to FIG. 3, a 1:n transformer compact model includes Co1s 301 and Co2s 302, which are parasitic capacitance values of a primary winding and a secondary winding, respectively.

In this case, as a frequency of an input signal inputted via a first port of the primary winding becomes higher, amplitude of a signal coupled via the Co1 301 becomes higher. When making the Co1 301 smaller than the Co2 302, since an impedance value of the Co1 301 becomes relatively greater than the Co2 302, the signal notably highly coupled with a second port is reduced, thereby improving amplitude imbalance between two output terminals, namely, the second port and a third port is improved.

A method of making the Co1 301 smaller than the Co2 302 will be described referring to FIGS. 4 through 6.

Figure 4:
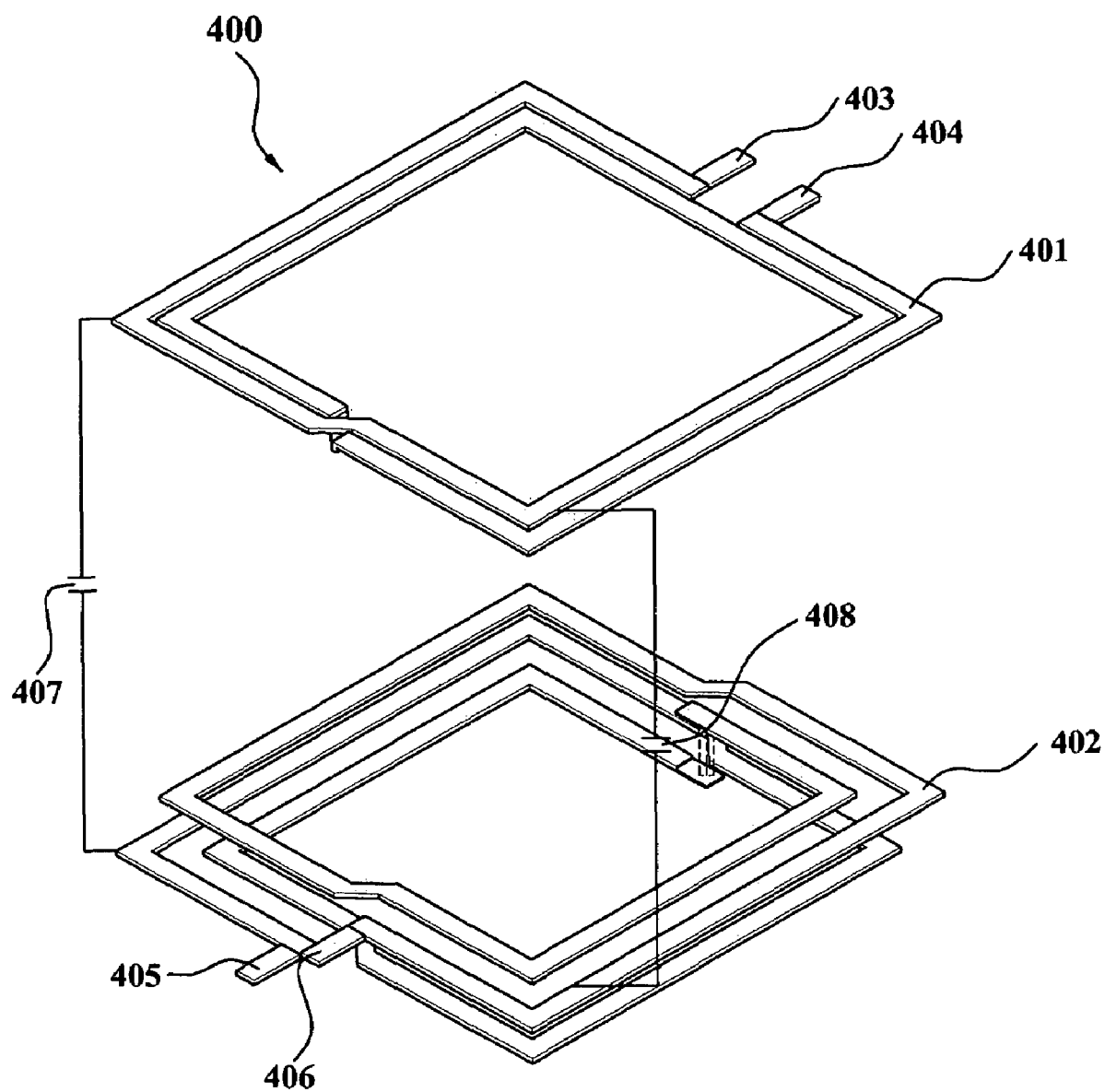
FIG. 4 is a diagram illustrating a structure of an on-chip transformer balun, according to an exemplary embodiment of the present invention.

FIG. 4 is a diagram illustrating a structure of an on-chip transformer balun 400, according to an exemplary embodiment of the present invention. As shown in FIG. 4, the on-chip transformer balun 400 may include a primary winding 401 and a secondary winding 402.

The primary winding 401 is connected to a first port 403 and a ground 404 and performs as an input terminal of the on-chip transformer balun 400, receiving an input signal via the first port 403.

The secondary winding 402 includes a first metal layer and a second metal layer, which are two metal layers disposed on mutually different layers. The first metal layer and the second metal layer are connected to a second port 405 and a third port 406, respectively, to perform as output terminals of the on-chip transformer balun 400.

As described above, when the secondary winding 402 includes the first metal layer and the second metal layer, the amplitude imbalance occurring between the second port 405 and the third port 406, which are the two output terminals of the secondary winding 402, in a high frequency band may be improved by controlling parasitic capacitance coupling by using a difference between a physical distance between the primary winding 401 and the first metal layer and a physical distance between the primary winding 401 and the second metal layer.

In this case, the parasitic capacitance coupling may be controlled by using a Co1 407 that is a parasitic capacitance value between the primary winding 401 and the first metal layer, and a Co2 408 that is a parasitic capacitance value between the primary winding 401 and the second metal layer. Also, when the Co1 407 has a relatively smaller value than the Co2 408, an impedance value of the Co1 407 is relatively greater than an impedance value of the Co2 408, thereby reducing signals dominantly coupled with one of the two output terminals. The Co1 407 and the Co2 408 may be inversely proportional to the distance between the primary winding 401 and the first metal layer and the distance between the primary winding 401 and the second metal layer. In addition, the high frequency band may include a band of 5 GHz.

Namely, since the distance between the primary winding 401 and the first metal layer is different from the distance between the primary winding 401 and the second metal layer by separating the secondary winding 402 into the first metal layer and the second metal layer, values of the Co1 407 and the Co2 408, which are inversely proportional to the distances, may be changed. In detail, since the physical distance between the primary winding 401 and the first metal layer becomes greater than the physical distance between the primary winding 401 and the second metal layer, the Co1 407 may be made smaller than the Co2 408 by using a property in which the value of the Co1 407 is inversely proportional to the lengthened distance.

As described above, the on-chip transformer balun 400 according to the exemplary embodiment may improve the amplitude imbalance by controlling parasitic capacitance by separating one of a primary winding and a secondary winding into a plurality of metal layers disposed on mutually different layers and using a difference between a physical distance between the plurality of the separated metal layers and the primary winding, or a physical distance between the plurality of the separated metal layers and the secondary winding.

Also, an information distortion phenomenon due to ingress of an undesirable signal, caused by the amplitude imbalance, in a direct transformation receiver, may be reduced by improving a common mode noise reduction property by improving the amplitude imbalance between the two output terminals of the on-chip transformer balun in a high frequency band.

In addition, the on-chip transformer balun may be integrated to RFICs instead of being an off-chip balun by improving limitation of a property of the high frequency band of the on-chip transformer balun by using the improved amplitude imbalance.

A structure for improving the amplitude imbalance, not described above, in which the primary winding is separated into the plurality of the metal layers, will be described in detail later referring to FIG. 6.

Figure 5:
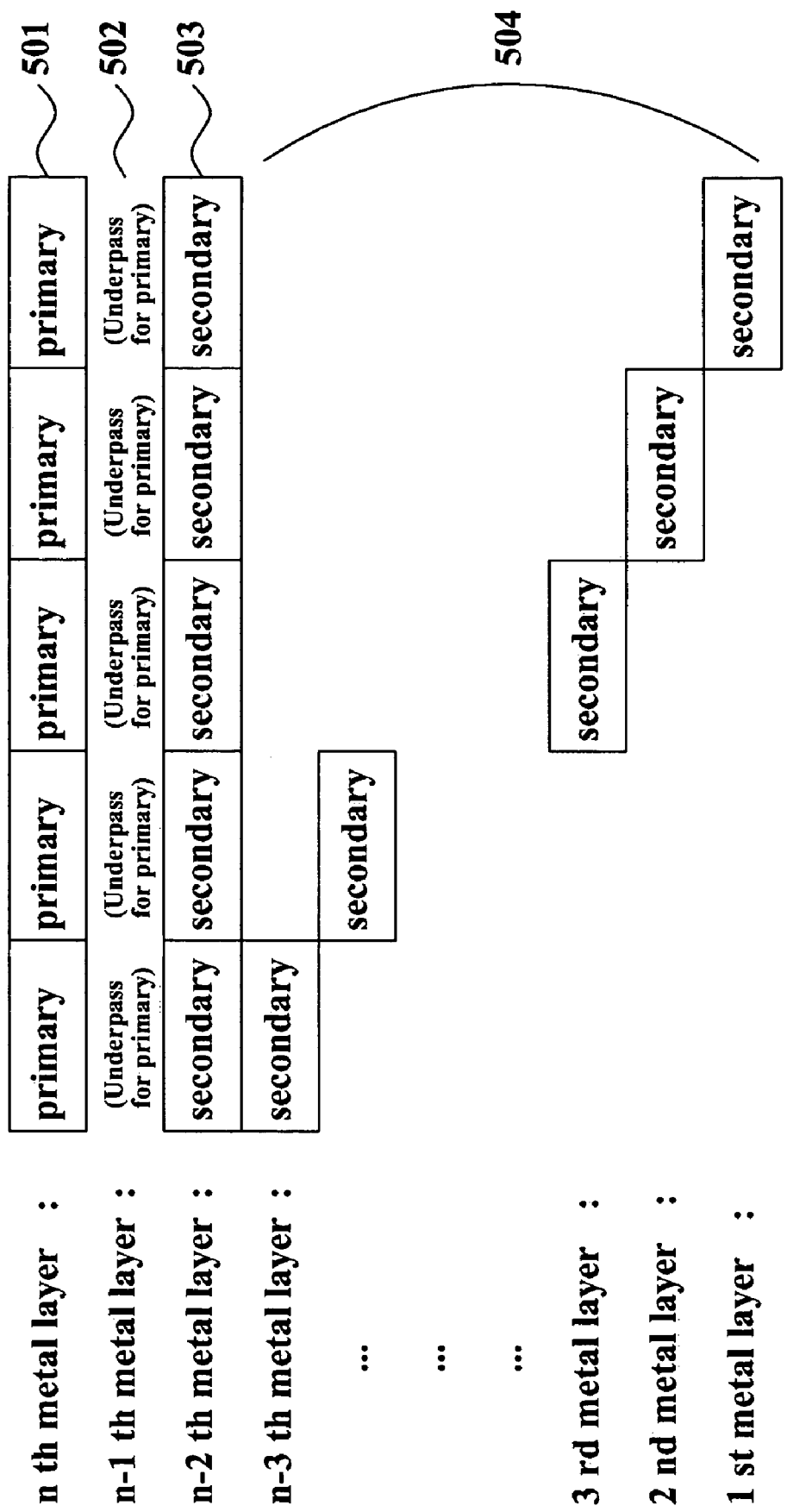
FIG. 5 is a diagram illustrating a structure of a secondary winding asymmetrically designed, according to an exemplary embodiment of the present invention.

FIG. 5 is a diagram illustrating a structure of a secondary winding asymmetrically designed, according to an exemplary embodiment of the present invention. As shown in FIG. 5, in an on-chip transformer balun, a primary winding 501 becomes an nth metal layer, an underpass 502 for the primary winding 501 and a second metal layer 503 of a secondary winding are sequentially disposed, and a position of a first metal layer 504 of the secondary winding is designed to be changed in an n–3th metal layer to a 1st metal layer, thereby controlling a distance between the first metal layer 504 and the primary winding 501.

Specifically, the distance between the first metal layer 504 and the primary winding 501 is changed by variously changing the position of the first metal layer 504, thereby improving the amplitude imbalance by controlling the position of the first metal layer 504 to make the Co1 407 less than the Co2 408 as described referring to FIG. 4.

Figure 6:
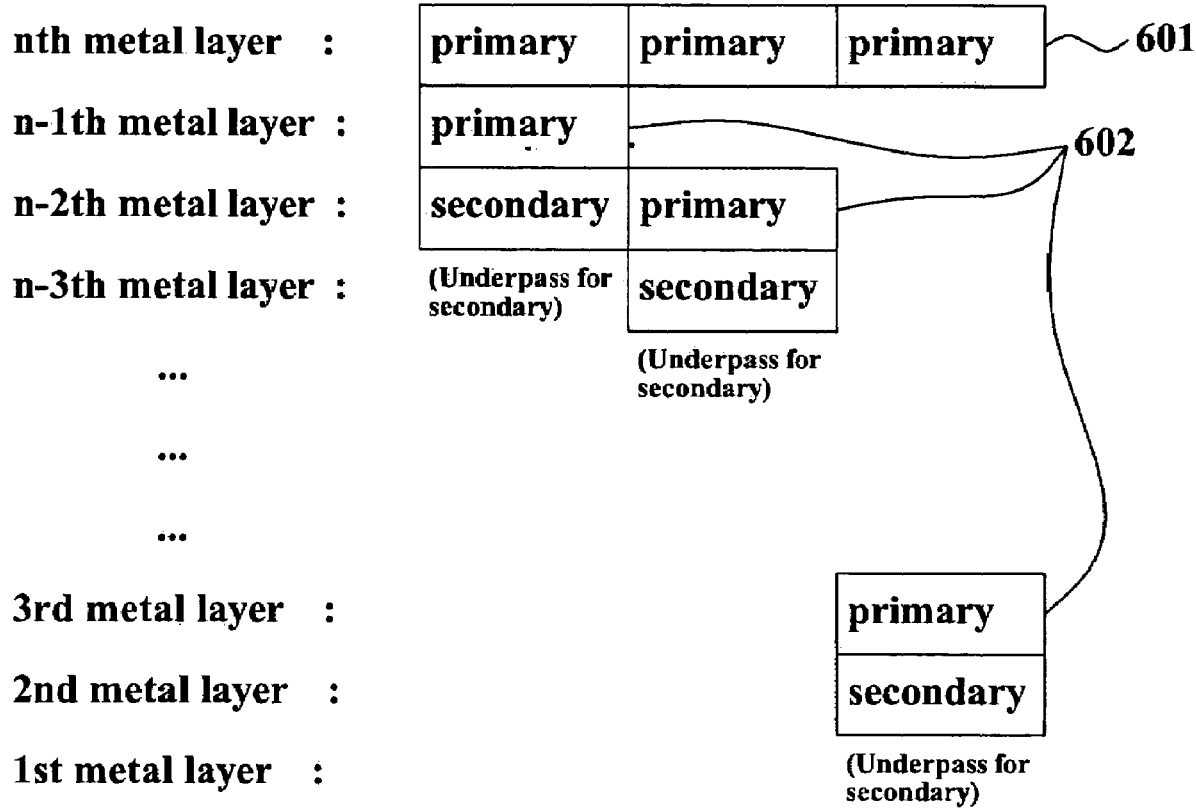
FIG. 6 is a diagram illustrating a structure of a primary winding asymmetrically designed, according to another exemplary embodiment of the present invention.

FIG. 6 is a diagram illustrating a structure of a primary winding asymmetrically designed, according to another exemplary embodiment of the present invention. In FIG. 6, unlike the structure illustrated in FIGS. 4 and 5, a primary winding is separated into a first metal layer 601 and a second metal layer 602, disposed on mutually different layers, the first metal layer 601 becomes an nth metal layer, and a position of the second metal layer 602 that is a secondary winding, and an underpass for the secondary winding, sequentially arranged, is differently established.

In this case, the amplitude imbalance may be improved by controlling the position of the three layers to make a Co1 that is a value of parasitic capacitance between the first metal layer 601 and the secondary winding, less than a Co2 that is a value of parasitic capacitance between the second metal layer and the secondary winding.

Figure 7A:
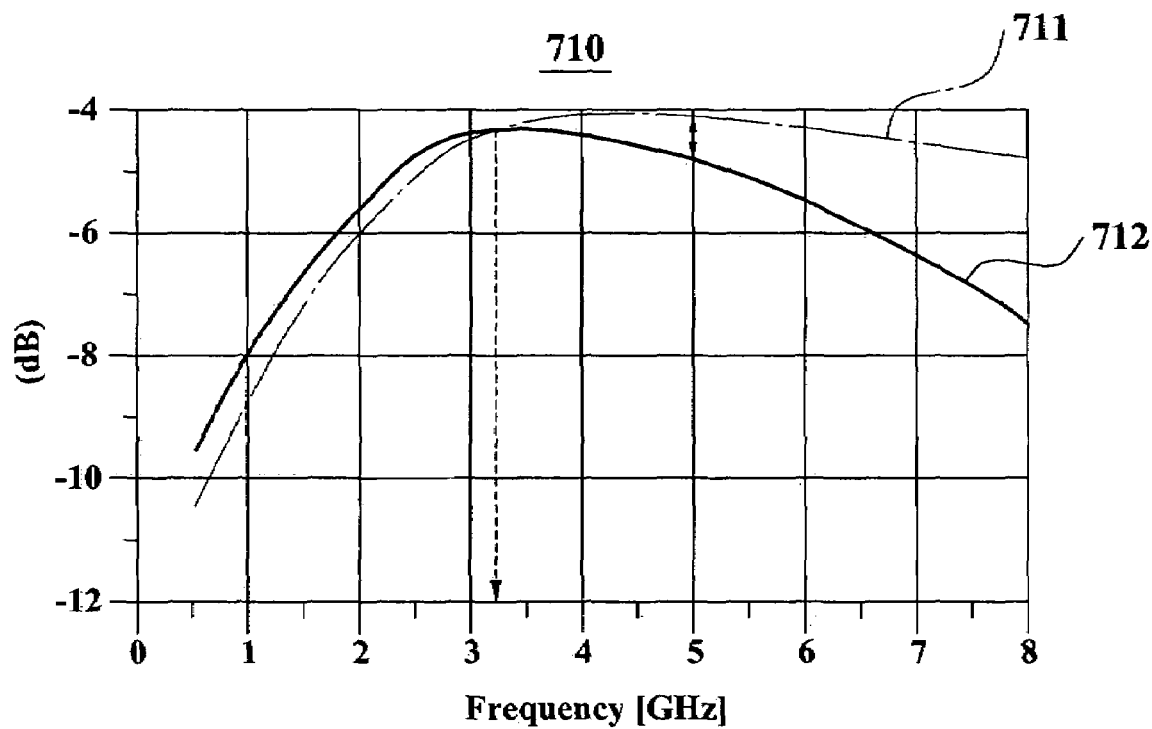
FIGS. 7A and 7B are diagrams illustrating examples for comparing available frequency bands according to amplitude.
Figure 7B:
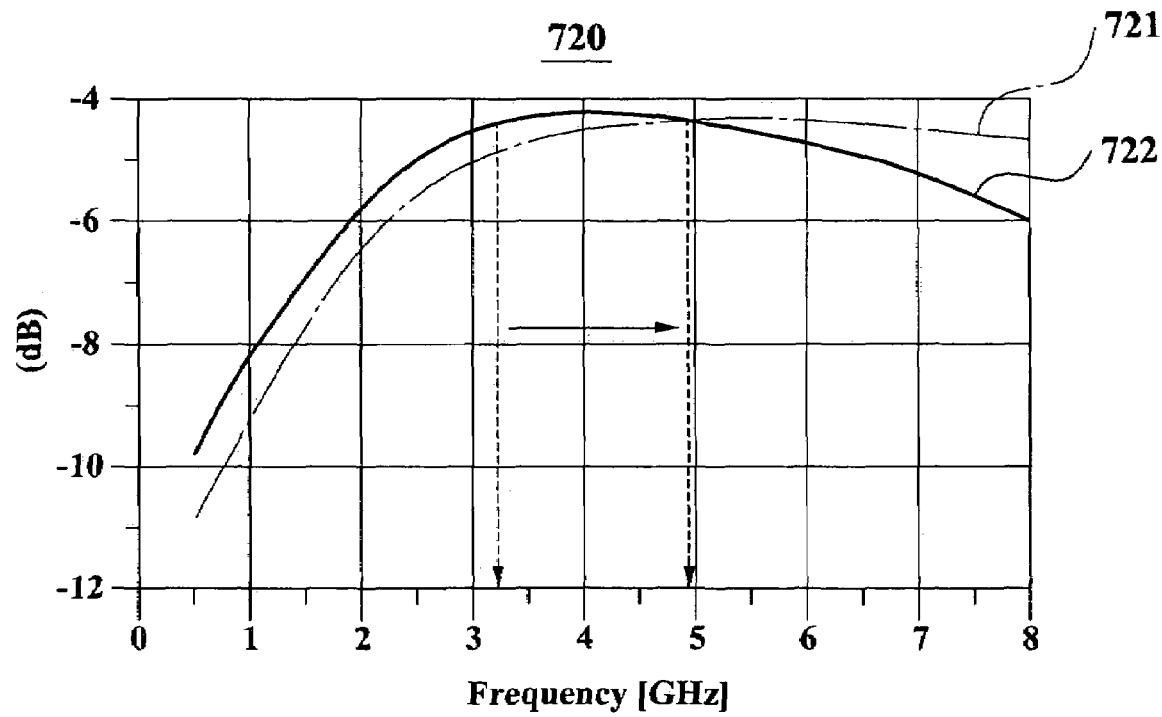

FIGS. 7A and 7B are diagrams illustrating examples for comparing a usable frequency bandwidth according to amplitude.

A graph 710 illustrates a property of a conventional transformer balun. As shown in the graph 710 via curves 711 and 712 charted by amplitude and frequency in a second port and a third port of output terminals, the available frequency band is limited to less than 3 GHz. Namely, in a high frequency band of 5 GHz, there is restriction on using the conventional transformer balun.

A graph 720 illustrates a property of the transformer balun according to the present invention. As shown in the graph 720 via curves 721 and 722 charted by amplitude and frequency in a second port and a third port of output terminals, one of a primary winding and a secondary winding is separated into a plurality of metal layers disposed on mutually different layers, thereby using the transformer balun according to the present invention in a high frequency band of 5 GHz, and applying the transformer balun to a device for vehicle turning signal, an RFIC, a transceiver, or an antenna matching terminal.

Figure 8:
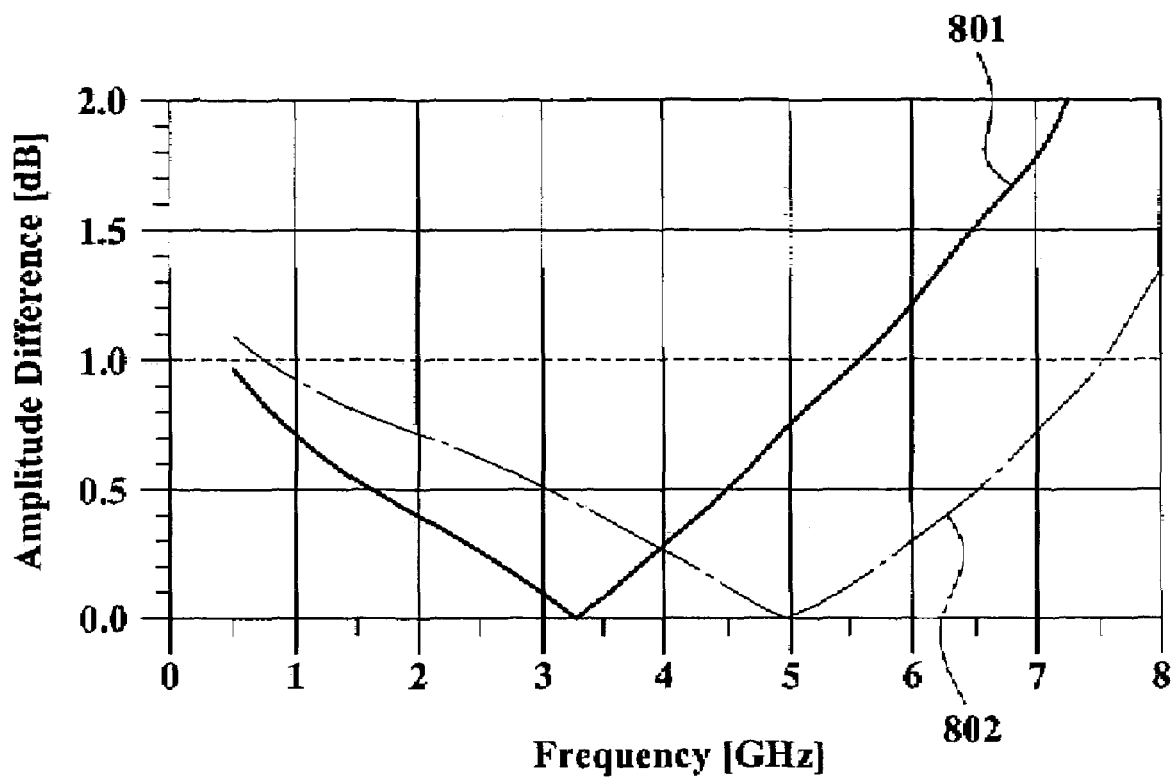
FIG. 8 is a diagram illustrating an example of a frequency band according to a difference of amplitude.

FIG. 8 is a diagram illustrating an example of a frequency band according to a difference of amplitude. In FIG. 8, considering that the amplitude imbalance of a general off-chip balun is approximately at most 1 dB, the on-chip transformer balun according to an embodiment of the present invention may be used in a 5 GHz frequency band that is a high frequency band. In a curve 801 indicating a frequency band according to a difference of amplitude in a conventional technology, the difference of the amplitude is 0.0 at approximately 3 GHz. In a curve 802 according to an embodiment of the present invention, the difference of the amplitude is 0.0 at approximately 5 GHz. This is an example showing that amplitude imbalance in the high frequency band, of the on-chip transformer balun according to the present invention, is improved.

As described above referring to FIGS. 3 through 8, the on-chip transformer balun according to the exemplary embodiments of the present invention may be used in the high frequency band by changing the parasitic capacitance by improving the amplitude imbalance by separating one of a primary winding and a secondary winding into a plurality of metal layers disposed on mutually different layers.

According to the exemplary embodiments of the present invention, the amplitude imbalance may be improved by controlling parasitic capacitance by separating one of a primary winding and a secondary winding into a plurality of metal layers disposed on mutually different layers and using a difference between a physical distance between the plurality of the separated metal layers and the primary winding, or a physical distance between the metal layers and the secondary winding.

Also, according to the exemplary embodiments of the present invention, an information corruption phenomenon due to ingress of an undesirable signal, caused by the amplitude imbalance, in a direct transformation receiver, may be reduced by improving a common mode noise reduction property by improving the amplitude imbalance between the two output terminals of the on-chip transformer balun in a high frequency band.

Also, according to the exemplary embodiments of the present invention, the on-chip transformer balun may be integrated into RFICs, instead of being an off-chip balun, by improving limitation of a property of the high frequency band of the on-chip transformer balun by using the improved amplitude imbalance.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An on-chip transformer balun comprising:

a primary winding as an input terminal of the on-chip transformer balun; and a secondary winding as an output terminal of the on-chip transformer balun, wherein one of the primary winding and secondary winding is seperated into a plurality of metal layers in which a spiral trace portion excluding an underpass is disposed on mutually different layers to have an asymmetrical structure, wherein the plurality of metal layers comprises a first metal layer and a second metal layer; and when the secondary winding is formed of the plurality of metal layers, amplitude imbalance generated between two output terminals of the secondary winding in a high frequency band is improved by controlling parisitic capacitance coupling by using a difference between a physical distance between the primary winding and the first metal layer and a physical distance between the primary winding and the second metal layer.

2. The on-chip transformer balun of claim 1, wherein the high frequency band comprises 5 GHz.

3. The on-chip transformer balun of claim 1, wherein the parasitic capacitance coupling is controlled by a Co1 that is a parasitic capacitance value of the primary winding and the first metal layer, and a Co2 that is a parasitic capacitance value of the primary winding and the second metal layer.

4. The on-chip transformer balun of claim 3, wherein the Co1 and the Co2 are determined to be inversely proportional to the distance between the primary winding and the first metal layer and the distance between the primary winding and the second metal layer.

5. An on-chip transformer balun comprising:

a primary winding as an input terminal of the on-chip transformer balun; and a secondary winding as an output terminal of the on-chip transformer balun, wherein one of the primary winding and secondary winding is separated into a plurality of metal layers in which a spiral trace portion excluding an underpass is disposed on mutually different layers to have an asymmetrical structure, wherein the plurality of metal layers comprises the first metal layer and the second metal layer; and when the primary winding is formed of the plurality of metal layers, amplitude imbalance generated between two output terminals of the secondary winding in a high frequency band is improved by controlling parasitic capacitance coupling by using a difference between a physical distance between the secondary winding and the first metal layer, and a physical distance between the secondary winding and the second metal layer.

6. The on-chip transformer balun of claim 5, wherein the parasitic capacitance coupling is controlled by a Co1 that is a parasitic capacitance value of the secondary winding and the first metal layer and a Co2 that is a parasitic capacitance value of the secondary winding and the second metal layer.

7. The on-chip transformer balun of claim 6, wherein the Co1 and the Co2 are determined to be inversely proportional to the distance between the secondary winding and the first metal layer, and the distance between the secondary winding and the second metal layer.

8. The on-chip transformer balun of claim 5, wherein the primary winding is connected to a first port and a ground, and the secondary winding is connected to a second port and a third port.

* * * * *